US009041180B2

(12) United States Patent
Lee

(10) Patent No.: US 9,041,180 B2
(45) Date of Patent: May 26, 2015

(54) SEMICONDUCTOR PACKAGE AND METHOD OF MANUFACTURING THE SEMICONDUCTOR PACKAGE

(71) Applicant: Yong-Kwan Lee, Hwaseong-si (KR)

(72) Inventor: Yong-Kwan Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/295,577

(22) Filed: Jun. 4, 2014

(65) Prior Publication Data
US 2014/0361442 A1 Dec. 11, 2014

(30) Foreign Application Priority Data

Jun. 10, 2013 (KR) .......................... 10-2013-0065623

(51) Int. Cl.
*H01L 23/02* (2006.01)
*H01L 25/11* (2006.01)
*H01L 21/00* (2006.01)
*H01L 21/48* (2006.01)
*H01L 23/00* (2006.01)

(52) U.S. Cl.
CPC .............. *H01L 23/564* (2013.01); *H01L 24/70* (2013.01); *H01L 24/89* (2013.01)

(58) Field of Classification Search
CPC ........ H01L 23/564; H01L 24/70; H01L 24/89
USPC ................... 257/685, 686, E25.027; 438/109
See application file for complete search history.

(56) References Cited

U.S. PATENT DOCUMENTS

| 5,900,675 | A | 5/1999 | Appelt et al. | |
|---|---|---|---|---|
| 6,737,589 | B2 * | 5/2004 | Adachi et al. | 174/254 |
| 7,196,411 | B2 | 3/2007 | Chang | |
| 7,279,789 | B2 | 10/2007 | Cheng | |
| 7,462,940 | B2 * | 12/2008 | Bauer et al. | 257/778 |
| 7,737,539 | B2 | 6/2010 | Kwon et al. | |
| 7,884,487 | B2 | 2/2011 | Yang et al. | |
| 8,237,275 | B2 | 8/2012 | Thorne et al. | |
| 8,508,954 | B2 * | 8/2013 | Kwon et al. | 361/790 |
| 2007/0141761 | A1 | 6/2007 | Lin et al. | |
| 2007/0246821 | A1 | 10/2007 | Lu et al. | |
| 2007/0278665 | A1 | 12/2007 | Cheng | |

(Continued)

FOREIGN PATENT DOCUMENTS

JP 2007042762 A 2/2007
JP 2008211193 A 9/2008

(Continued)

*Primary Examiner* — Luan C Thai
(74) *Attorney, Agent, or Firm* — Harness, Dickey & Pierce, P.L.C.

(57) ABSTRACT

The stack package includes a first semiconductor package and a second semiconductor package. The first semiconductor package includes a first substrate having a first modulus and at least one semiconductor chip mounted on the first substrate. The second semiconductor package stacked on the first semiconductor package and includes a second substrate having a second modulus and at least one semiconductor chip mounted on the second substrate. The second modulus is less than the first modulus. Even in the event that the first semiconductor package is under severe warpage due to a temperature change, the flexible second substrate, which includes e.g., polyimide or poly ethylene terephthalate, of the second semiconductor package may be less sensitive to the temperature change, thereby improving reliability of the stack package.

20 Claims, 18 Drawing Sheets

(56) References Cited

U.S. PATENT DOCUMENTS

| | | |
|---|---|---|
| 2009/0289362 A1 | 11/2009 | Rhyner et al. |
| 2010/0038764 A1 | 2/2010 | Lyne |
| 2010/0136745 A1 | 6/2010 | Hwang |
| 2011/0296680 A1 | 12/2011 | Dennis et al. |
| 2012/0068340 A1 | 3/2012 | Kimura |
| 2012/0155055 A1* | 6/2012 | Kang et al. .................... 361/820 |
| 2013/0020690 A1 | 1/2013 | Qiu et al. |

FOREIGN PATENT DOCUMENTS

| | | |
|---|---|---|
| JP | 2012182274 A | 9/2012 |
| KR | 100276054 B1 | 12/2000 |
| KR | 20030034515 A | 5/2003 |
| KR | 20080022452 A | 3/2008 |
| KR | 100833209 B1 | 5/2008 |
| KR | 20110056766 A | 5/2011 |
| KR | 20120122107 A | 11/2012 |

\* cited by examiner

SEMICONDUCTOR PACKAGE AND METHOD OF MANUFACTURING THE SEMICONDUCTOR PACKAGE

CROSS-REFERENCE TO RELATED APPLICATION(S)

This application claims priority under 35 USC §119 to Korean Patent Application No. 2013-0065623, filed on Jun. 10, 2013 in the Korean Intellectual Property Office (KIPO), the contents of which are herein incorporated by reference in their entirety.

BACKGROUND

1. Field

Example embodiments relate to semiconductor packages and methods of manufacturing the same. More particularly, example embodiments relate to semiconductor packages including stacked packages and methods of manufacturing the same.

2. Description of the Related Art

A package on package (POP) technology, in which a plurality of packages is stacked, has been proposed for high density chip stacking. Because only good packages proven by a test process are stacked, the POP technology can reduce failure rates.

The stack semiconductor package may include a first semiconductor package including a first substrate and a second semiconductor package including a second substrate. Conventionally, a printed circuit board (PCB) may be used as the first and second substrates. Due to the warpage of the stack semiconductor package at the solder melting temperature, reliability of the stack semiconductor package may be deteriorated. Thus, controlling (e.g., reducing or suppressing) warpage of a stack semiconductor package at a solder melting temperature is important.

SUMMARY

At least one example embodiment provides a stack semiconductor package improving warpage.

At least one example embodiment provides a method of manufacturing the stack semiconductor package.

According to one example embodiment, a stack package includes a first semiconductor package and a second semiconductor package. The first semiconductor package includes a first substrate having a first modulus and at least one semiconductor chip mounted on the first substrate. The second semiconductor package stacked on the first semiconductor package includes a second substrate having a second modulus and at least one semiconductor chip mounted on the second substrate. The first modulus is greater than the second modulus.

In an example embodiment, the second modulus may be within a range of about 1 GPa to about 7 GPa.

In an example embodiment, the second substrate may include at least one of polyimide and poly ethylene terephthalate.

In an example embodiment, a glass transition temperature of the second substrate may be greater than a glass transition temperature of the first substrate.

In an example embodiment, a glass transition temperature of the second substrate may be greater than or equal to 250 degrees Celsius.

In an example embodiment, the first semiconductor package may further include a first molding member covering the first semiconductor chip on the first substrate.

In an example embodiment, an upper surface of the first semiconductor chip may be exposed by the first molding member.

In an example embodiment, the stack package may further include a plurality of conductive connection members interposed between the first and the second substrates and provides electrical connectivity therebetween.

In an example embodiment, the conductive connection members may be arranged on a peripheral region of the first substrate.

According to another example embodiment, a stack package includes a first semiconductor package having a first substrate and at least one first semiconductor chip mounted on the first substrate and a second semiconductor package including a second substrate on the first semiconductor package. The first substrate has a first modulus and the second semiconductor package has a second modulus. The first modulus is greater than the second modulus.

The first semiconductor package may further includes a first molding member covering the first semiconductor chip and the first molding member may at least partially expose an upper surface of the first semiconductor chip.

The stack package may further includes at least one first pad on an upper surface of the first substrate, at least one second pad on a lower surface of the second substrate, and at least one conductive connection member interposed between the first and the second substrates and electrically connecting the first and second pads.

The first semiconductor package may further include a first molding member covering the first semiconductor chip and exposing the first pad.

The conductive connection member may at least partially fill openings in the first molding member and protrude from a top surface of the first molding member.

According to yet another example embodiment, a method of manufacturing a stack package includes forming a first semiconductor package by mounting at least one first semiconductor chip on a first substrate, forming a second semiconductor package mounting at least one second semiconductor chip on a second substrate, and stacking the second semiconductor package on the first semiconductor package. The first substrate has a first modulus. The second substrate has a second modulus, which is less than the first modulus.

In an example embodiment, the second modulus may be within a range of about 1 GPa to about 7 GPa.

In an example embodiment, the second substrate may include at least one of polyimide and poly ethylene terephthalate.

In an example embodiment, a glass transition temperature of the second substrate may be greater than a glass transition temperature of the first substrate.

In an example embodiment, a glass transition temperature of the second substrate may be greater than or equal to 250 degrees Celsius.

In an example embodiment, the stacking the second semiconductor package on the first semiconductor package may include interposing a plurality of conductive connection members between the first and the second substrates to provide electrical connection therebetween.

A stack package in accordance with some example embodiments may include the second substrate including a polyimide layer. The polyimide layer may be relatively thin, lightweight and flexible. The polyimide layer may have an excellent heat resistance and insulating properties and a higher glass transition temperature (TG).

Even though the first semiconductor package is under severe warpage due to a temperature change, the flexible second substrate of the second semiconductor package including polyimide or poly ethylene terephthalate may be less sensitive to the temperature change, thereby improve reliability of the stack package. Further, because the second substrate including polyimide or poly ethylene terephthalate is used, a thickness of the second substrate may be reduced. Due to the higher heat resistance of the second substrate including polyimide or poly ethylene terephthalate, a semiconductor package may have a finer pitch and/or may stack more semiconductor chips therein.

BRIEF DESCRIPTION OF THE DRAWINGS

Example embodiments will be more clearly understood from the following detailed description taken in conjunction with the accompanying drawings. FIGS. 1 to 15 represent non-limiting, example embodiments as described herein.

FIG. 1 is a cross-sectional view illustrating a stack package in accordance with an example embodiment.

FIG. 2 is a cross-sectional view illustrating a second substrate of the stacked package in FIG. 1.

FIG. 3 is a graph illustrating experimental results of warpage changes versus temperature changes.

FIGS. 7 to 13 illustrate a method of manufacturing a stack package in accordance with an example embodiment.

FIG. 14 is a cross-sectional view illustrating a stack package in accordance with an example embodiment.

FIG. 15 is a cross-sectional view illustrating a stack package in accordance with an example embodiment.

DETAILED DESCRIPTION OF THE EMBODIMENTS

Figure 1:
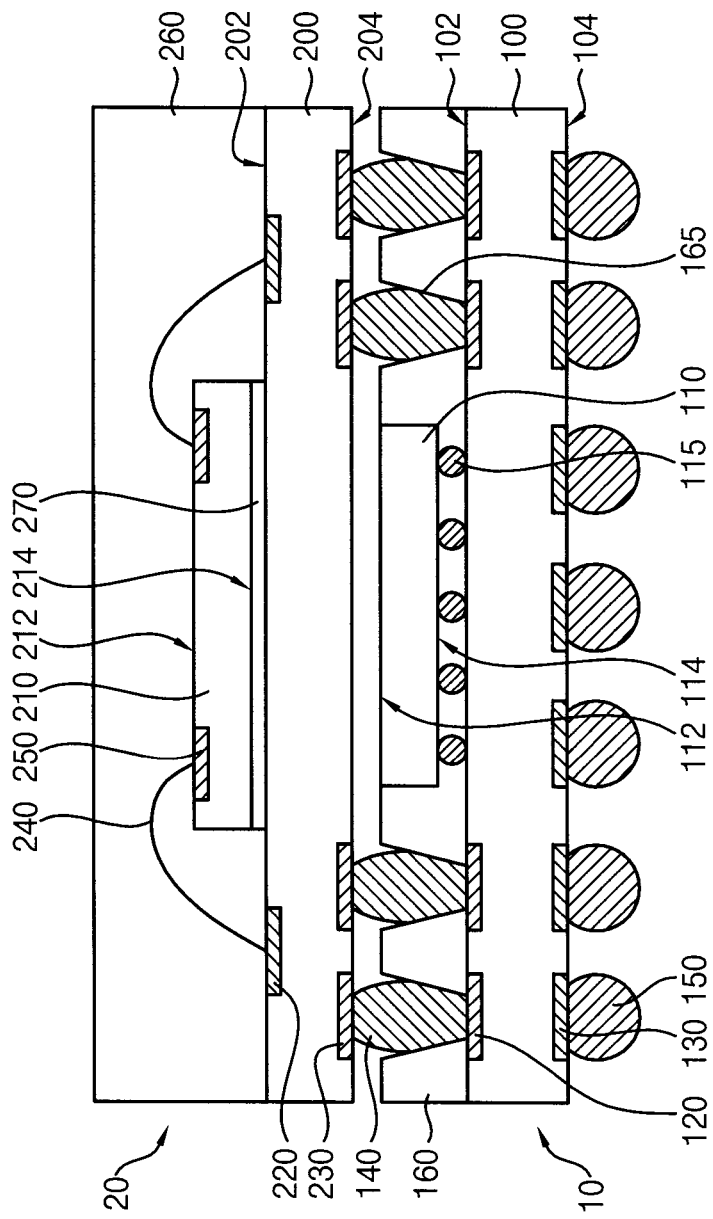

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in further detail with reference to the accompanying drawings.

Figure 2:
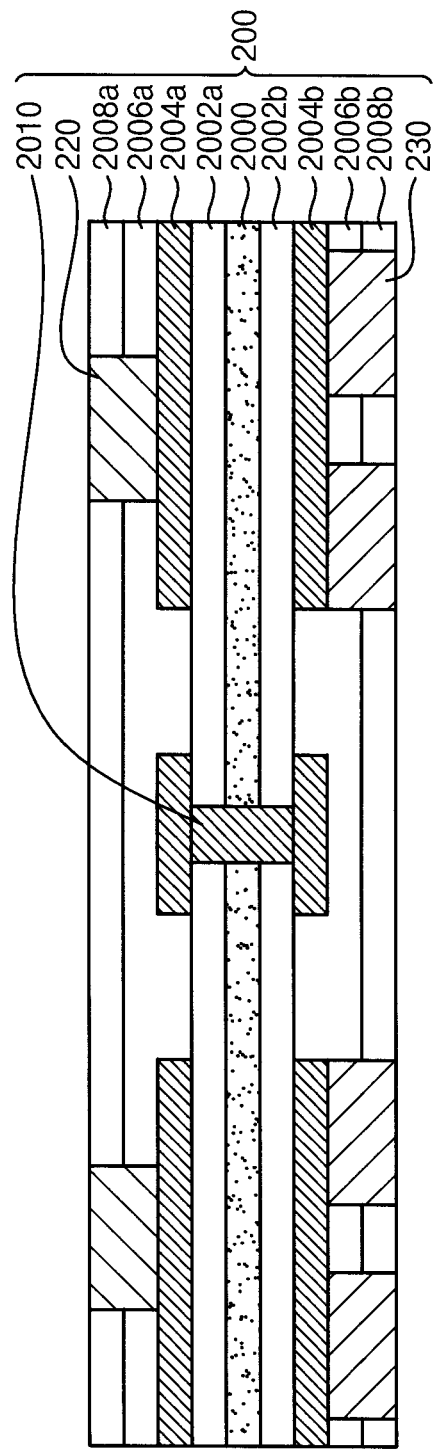

FIG. 1 is a cross-sectional view illustrating a stack package in accordance with an example embodiment. FIG. 2 is a cross-sectional view illustrating a second substrate of the stack package in FIG. 1.

Referring to FIG. 1, a stack package 1 includes a first semiconductor package 10, a second semiconductor package 20. The stack package 1 further includes conductive connection members 140.

The first semiconductor package 10 includes a first substrate 100, a first semiconductor chip 110, and a first molding member 160.

The first substrate 100, for example, may be a printed circuit board (PCB). The first substrate 100 includes first pads 120 on an upper surface 102 and second pads 130 on a lower surface 104 thereof. Although it is not illustrated in the figures, the first substrate 100 may further include various wirings which are electrically connected to the first and/or second pads 120 and 130.

In the example embodiment, a plurality of the first pads 120 is provided on the upper surface 102 of the first substrate 100. A plurality of the second pads 130 is provided on a lower surface of the first substrate 100. The first and second pads 120 and 130 may include a conductive material such as metal.

The first semiconductor chip 110 is mounted on the first substrate 100, e.g., on the upper surface 102 of the first substrate 100.

In the example embodiment, the first semiconductor chip 110 is attached to the upper surface 102 of the first substrate 100 by conductive bumps 115. The conductive bumps 115, for example, may include solder balls. Alternatively, the first semiconductor chip 110 may be attached to the first substrate 100 by an adhesive layer (not illustrated).

The first semiconductor chip 110 may include an application processor (AP) chip, a logic chip, etc.

The first molding member 160, for example, may include an insulating material such as epoxy molding compound (EMC).

The first molding member 160 is provided on the first substrate 100 and covers a sidewall and a bottom surface 114 of the first semiconductor chip 110 such that a top surface 112 of the first semiconductor chip 110 is exposed outside. The first molding member 160 has first openings 165 that expose the first pads 120.

The first pads 120 exposed by the first openings 165 are in contact with the conductive connection members 140. In example embodiments, the conductive connection members 140 may at least partially fill the first openings 165 of the first molding member 160. Further, the conductive connection members 140 may protrude from a top surface of the first molding member 160. Thus, the conductive connection members 140 may have top surfaces higher than the top surface 112 of the first semiconductor chip 110, which is not covered by the first molding member 160.

For example, the conductive connection members 140 may include solder.

The second semiconductor package 20 includes a second substrate 200, a second semiconductor chip 210, and a second molding member 260.

The second substrate 200, for example, may include polyimide or poly ethylene terephthalate. Hereinafter, a modulus of the first substrate 100 may be referred to as a first modulus and a modulus of the second substrate 200 may be referred to as a second modulus. For example, when the first substrate 100 is a printed circuit board and the second substrate 200 includes polyimide or poly ethylene terephthalate, the second modulus may be less than the first modulus.

Referring to FIG. 2, the second substrate 200 includes a polyimide layer 2000. The second substrate 200 further includes first adhesive layers 2002a and 2002b, second adhesive layers 2006a and 2006b, conductive layers 2004a and 2004b, covering layers 2008a and 2008b, and third and fourth pads 220 and 230. The second substrate 200 further includes various wirings 2010 which are electrically connected to the third and/or fourth pads 220 and 230.

The polyimide layer 2000 may be a film including polyimide. The polyimide layer 2000 may be thin, lightweight, and flexible. Also, the polyimide layer 2000 may have a higher heat resistance and better insulating properties and a higher glass transition temperature (TG). A glass transition temperature refers to a temperature region where a glassy material transits from a hard (e.g., solid) state to a soft (e.g., rubbery) state, thereby significantly changing structural properties of the glassy. Having a higher glass transition temperature may be beneficial to improve reliability of packages.

For example, the second modulus may be within a range of about 1 GPa to about 7 GPa. A glass transition temperature of the second substrate 200 may be greater than or equal to 250 degree Celsius.

Even in the event that the first semiconductor package undergoes severe warpage due to a temperature change, the flexible second substrate of the second semiconductor package including polyimide or poly ethylene terephthalate may be less sensitive to the temperature change, thereby improving reliability of the stack package. Further, because the second substrate includes polyimide or poly ethylene terephthalate, a thickness of the second substrate may be reduced. Due to the higher heat resistance of the second substrate including polyimide or poly ethylene terephthalate, a semiconductor package may have a finer pitch and/or may stack more semiconductor chips therein.

The conductive layers 2004a and 2004b may include a metal such as copper. The covering layers 2008a and 2008b may include an insulation material. The covering layers 2008a and 2008b may increase mechanical strength of the second substrate 200 and may protect the conductive layers 2004a and 2004b. The polyimide layer 2000 and conductive layers 2004a and 2004b may be coupled by the first adhesive layers 2002a and 2002b, and the conductive layers 2004a and 2004b and covering layers 2008a and 2008b may be coupled by the second adhesive layers 2006a and 2006b.

Although it is not illustrated in FIG. 1, the second substrate 200 may further include various wirings (not illustrated) which are electrically connected to the third and/or fourth pads 220 and 230.

In the example embodiment, a plurality of the fourth pads 230 is provided on a lower surface 204 of the second substrate 200. The fourth pads 230 are positioned corresponding to the first pads 120 of the first substrate 100, and are in contact with the conductive connection members 140. A plurality of third pads 220 is provided on an upper surface 202 of the second substrate 200. The third and the fourth pads 220 and 230 may include a conductive material, e.g., a metal.

The first and second semiconductor packages 10 and 20 are electrically connected to each other via the first pads 120 on the upper surface 102 of the first substrate 100, the conductive connection members 140 on the first pads 120, and the fourth pads 230 on the lower surface 204 of the second substrate 200 making contact with the conductive connection members 140.

The second semiconductor chip 210 is mounted on the second substrate 200. For example, the second semiconductor chip 210 is mounted on the upper surface 202 of the second substrate 200. In this example embodiment, a lower surface 214 of the second semiconductor chip 210 is attached to the upper surface 202 of the second substrate 200 using an adhesive layer 270. Alternatively, the second semiconductor chips 210 may be attached to the upper surface 202 of the second substrate 200 using conductive bumps (not illustrated) such as solder balls.

The second semiconductor chip 210 includes a fifth pad 250 on an upper surface 212 of the second semiconductor chip 210. In this example embodiment, a plurality of the fifth pads 250 is formed. The fifth pad 250 may include a conductive material, e.g., a metal.

The fifth pads 250 of the second semiconductor chip 210 and the third pads 220 are electrically connected to each other, respectively, via a conductive wire 240. However, when the second semiconductor chip 210 is attached to the second substrate 200 by conductive bumps, the conductive wire 240 may not be formed.

The first semiconductor chip 210 may include, e.g., a memory chip.

The second molding member 260, for example, may include an insulating material such as EMC, etc. The second molding member 260 may be formed on the second substrate 200, and may seal the second semiconductor chip 210, the adhesive layer 270, and the conductive wires 240, thereby protecting the second semiconductor chip 210 from external environment.

In FIG. 1, the case in which the second semiconductor package 20 has only one second semiconductor chip 210 is shown, however, example embodiments are not limited thereto. For example, the second semiconductor package 20 may include a plurality of sequentially stacked semiconductor chips.

Also, in FIG. 1, the case in which the first semiconductor package 10 has only one first semiconductor chip 110 is shown, however, example embodiments are not limited thereto. For example, the first semiconductor package 10 may include a plurality of sequentially stacked semiconductor chips.

Also, in FIG. 1, the case in which the stack package has only two semiconductor packages 10 and 20 is shown, however, example embodiments are not limited thereto. For example, the stacked semiconductor package may include more than two sequentially stacked semiconductor packages.

Outer connection members 150 are disposed on the second pads 130, and the first substrate 100 may be electrically connected to a mainboard (not illustrated) via the outer connection members 150.

Figure 3:
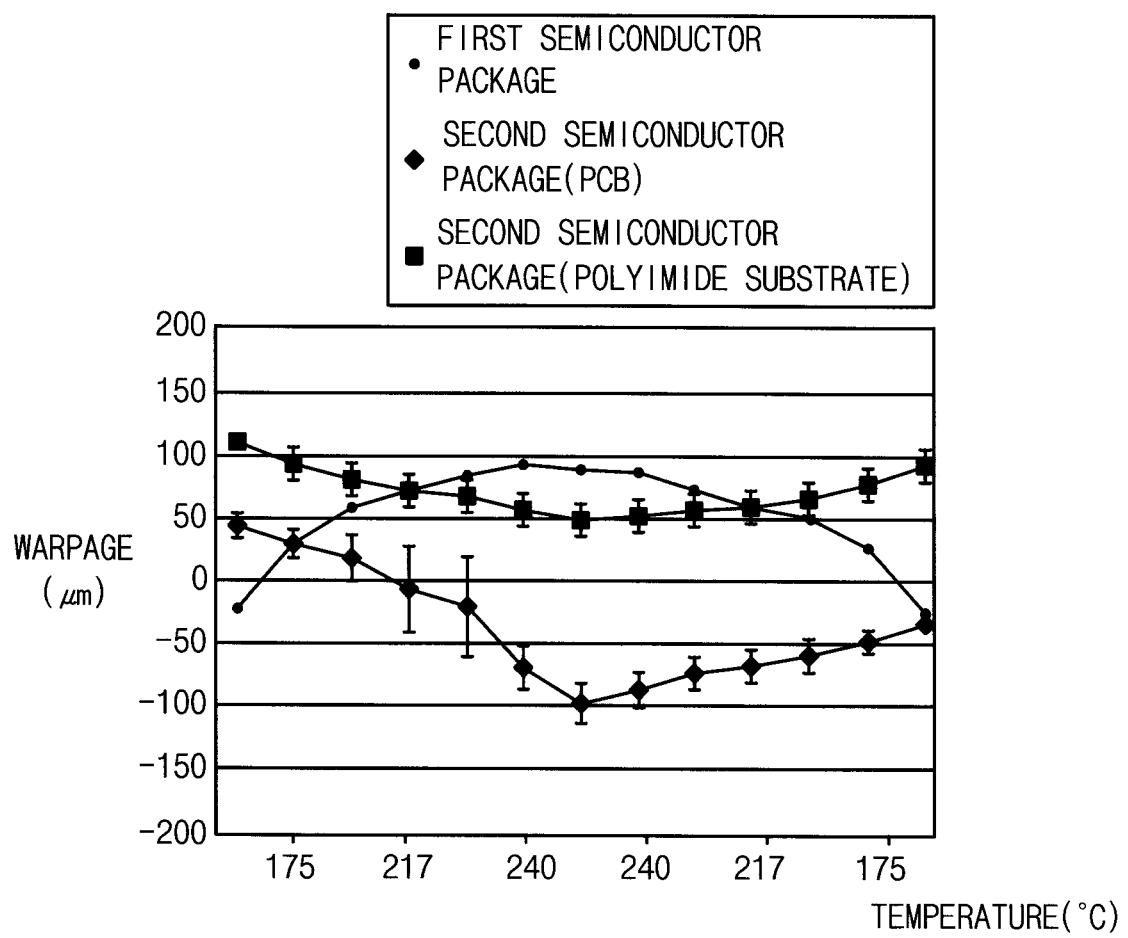
Figure 4A:
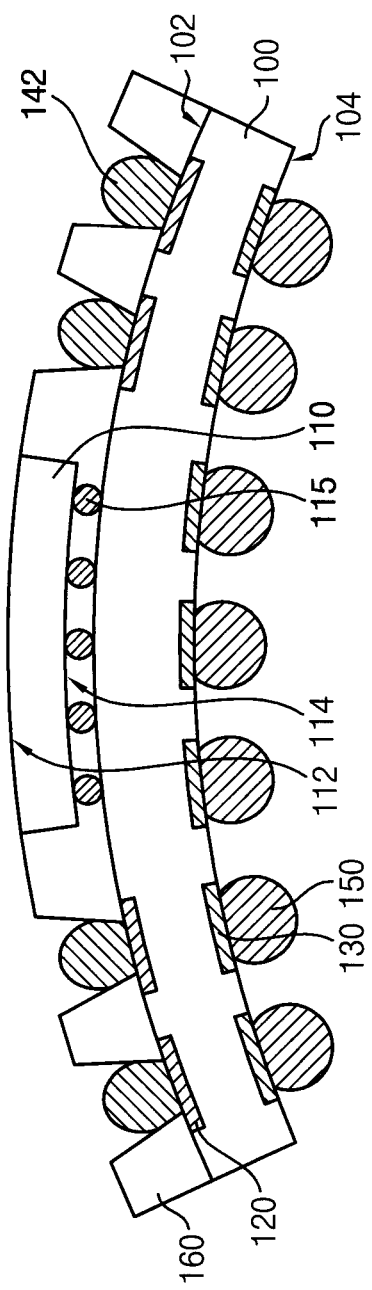
FIGS. 4A and 4B are cross-sectional views illustrating warpage of a first semiconductor at 175 degrees Celsius and 250 degrees Celsius.
Figure 4B:
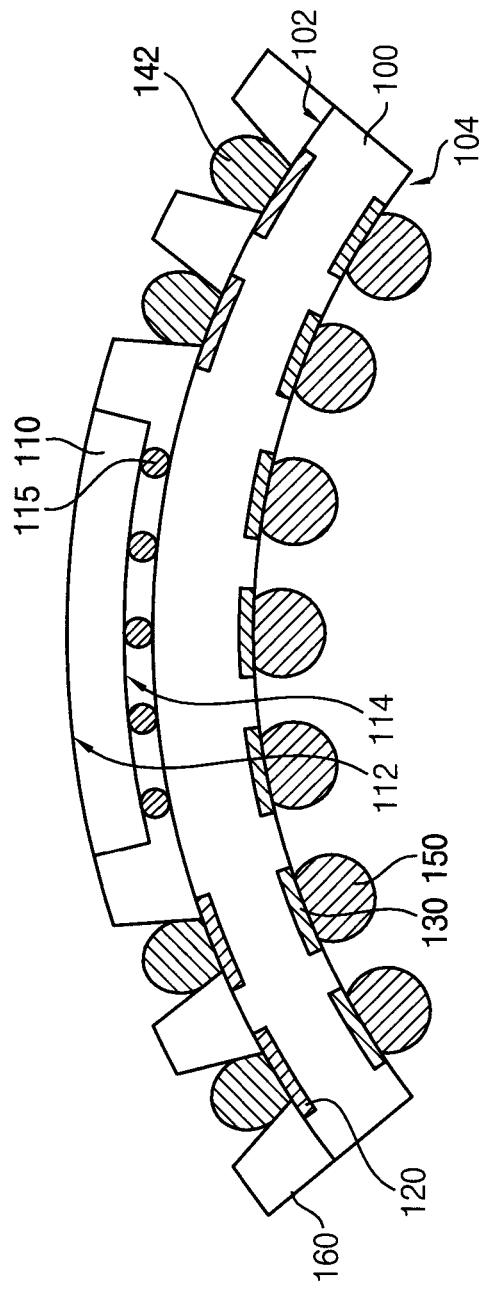
Figure 5A:
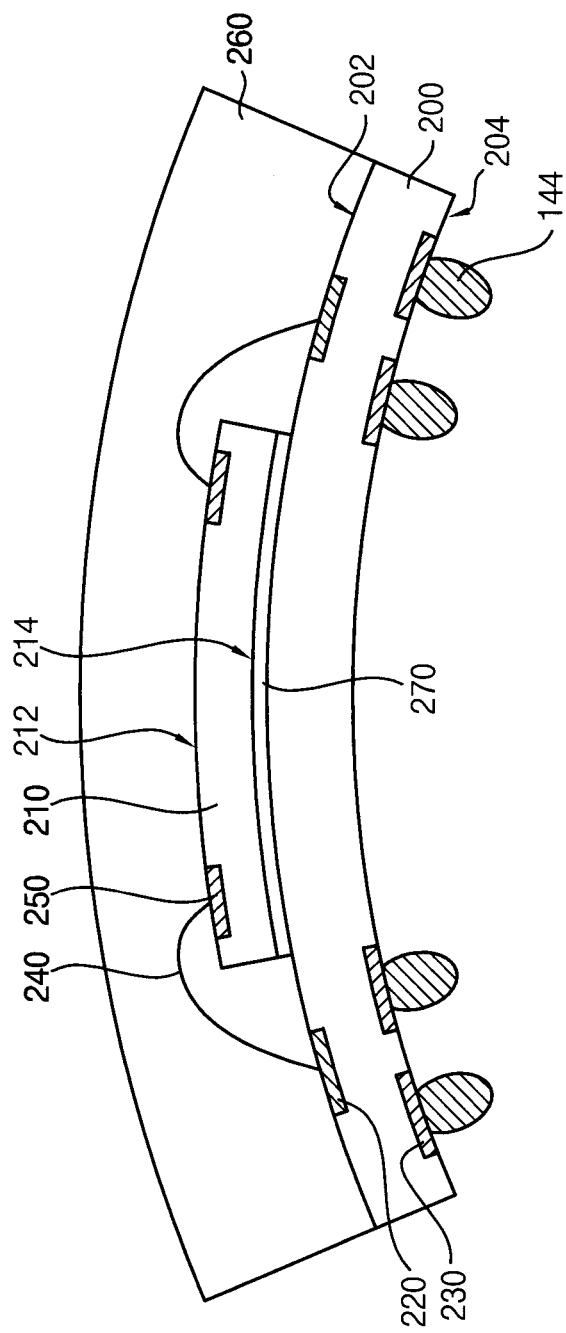
FIGS. 5A and 5B are cross-sectional views illustrating warpage of a second semiconductor package including a conventional PCB at 175 degrees Celsius and 250 degrees Celsius.
Figure 5B:
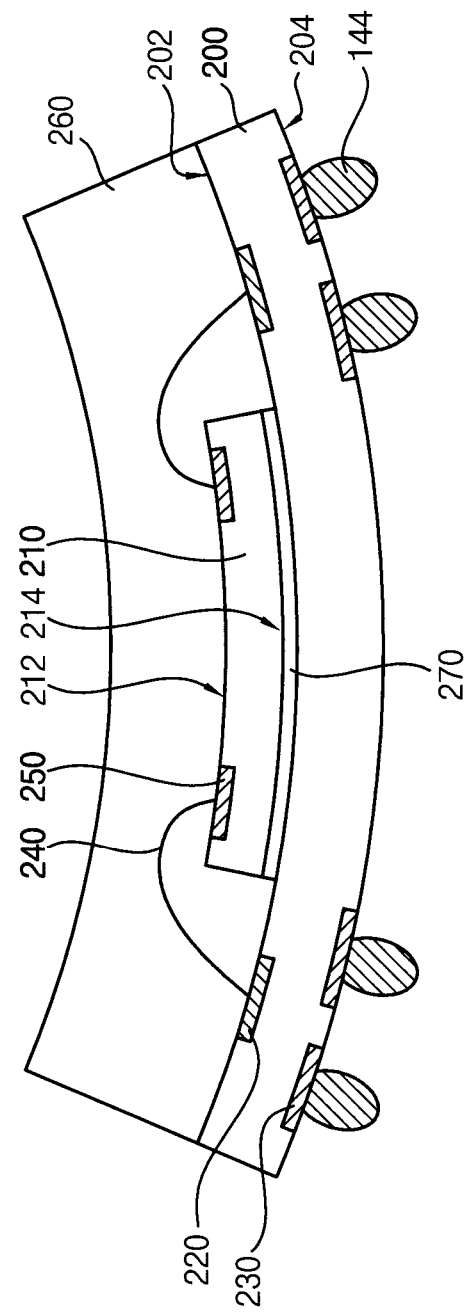
Figure 6A:
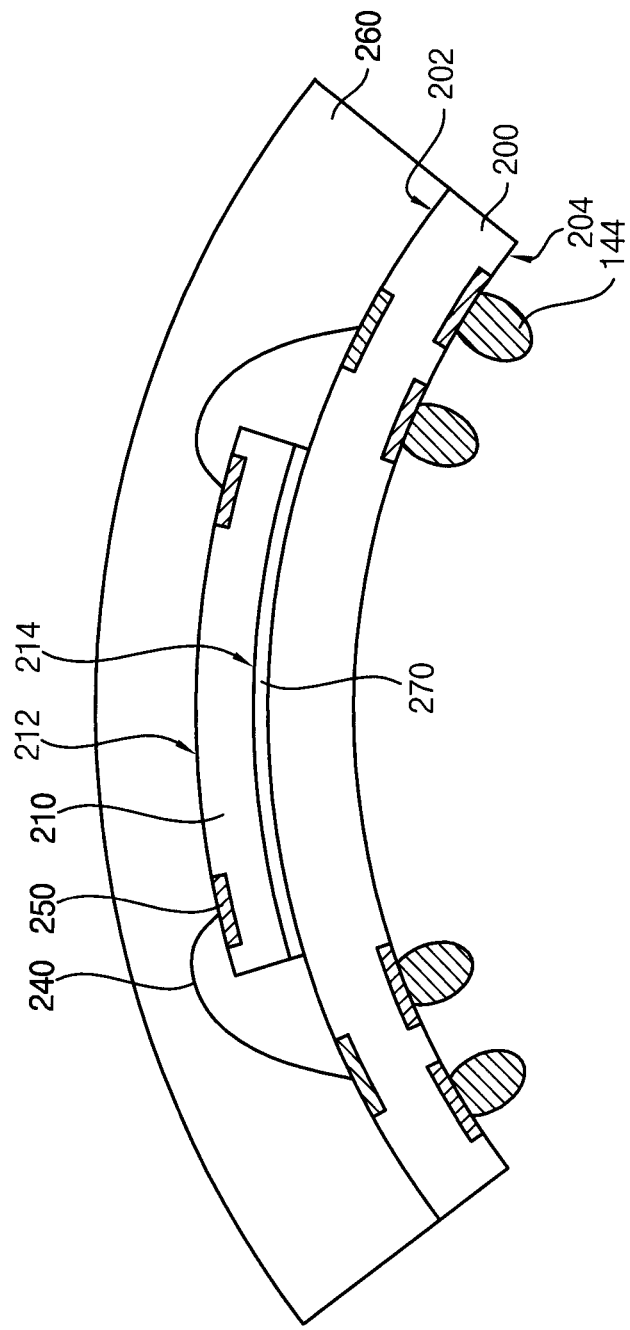
FIGS. 6A and 6B are cross-sectional views illustrating warpage of a second semiconductor package including a polyimide substrate at 175 degrees Celsius and 250 degrees Celsius.
Figure 6B:
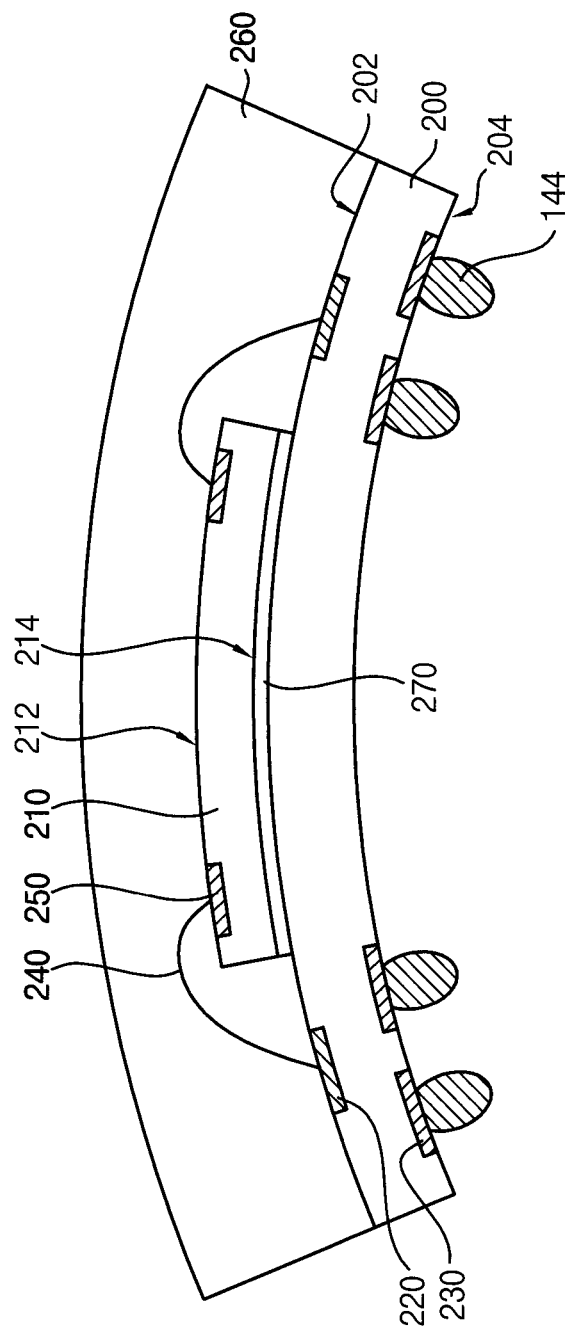

FIG. 3 is a graph illustrating experimental results of warpage changes versus temperature changes. FIGS. 4A and 4B are cross-sectional views illustrating warpage of a first semiconductor package at 175 degrees Celsius and 250 degrees Celsius. FIGS. 5A and 5B are cross-sectional views illustrating warpage of a second semiconductor package including a conventional PCB at 175 degrees Celsius and 250 degrees Celsius. FIGS. 6A and 6B are cross-sectional views illustrating warpage of a second semiconductor package including a polyimide substrate at 175 degrees Celsius and 250 degrees Celsius in accordance with example embodiments.

FIG. 3 shows warpage changes of a first semiconductor package, a second semiconductor package including a conventional PCB, and a second semiconductor package including a polyimide substrate with respect to temperature changes. A positive value and a negative value of warpage changes in FIG. 3 represent convex-type and concave-type of warpages in a cross-sectional view, respectively.

When temperature is changed from 175 degrees Celsius to 250 degrees Celsius, warpage of the first semiconductor package is changed from +25 μm to +100 μm and warpage of the second semiconductor package including the conventional PCB is changed from +25 μm to −100 μm. Warpage of the second semiconductor package including a polyimide substrate is changed from +100 μm to +50 μm.

Because solders of the stack package may be melted at a temperature more than 175 degrees Celsius, warpage of the stack package at more than 175 degrees Celsius may significantly affect reliability of the stack package.

Referring to FIGS. 4A and 4B, warpages of a first semiconductor package at 175 degrees Celsius and 250 degrees Celsius are illustrated, respectively. Referring to FIGS. 5A and 5B, warpages of a second semiconductor package including a conventional PCB at 175 degrees Celsius and 250 degrees Celsius are illustrated, respectively. In consideration of bending shapes of the first and the second semiconductor packages at 250 degree Celsius, the warpage of the stack packages may cause a severe problem at that temperature.

In example embodiments, the second semiconductor package may include a polyimide substrate. The polyimide substrate may have a higher heat resistance, better bending properties and a modulus less than that of a PCB substrate. Accordingly, warpage of a second semiconductor package including the polyimide substrate may substantially come from the second molding member, but may not substantially come from the second substrate.

Referring to FIGS. 6A and 6B, warpage of a second semiconductor package including a polyimide substrate at 175 degrees Celsius and 250 degrees Celsius are illustrated, respectively. The first and the second semiconductor packages have the same convex warpage at 250 degrees Celsius, thereby improving reliability of the stack package.

Hereinafter, a method of manufacturing the stack package in FIG. 1 will be explained in detail.

Figure 9:
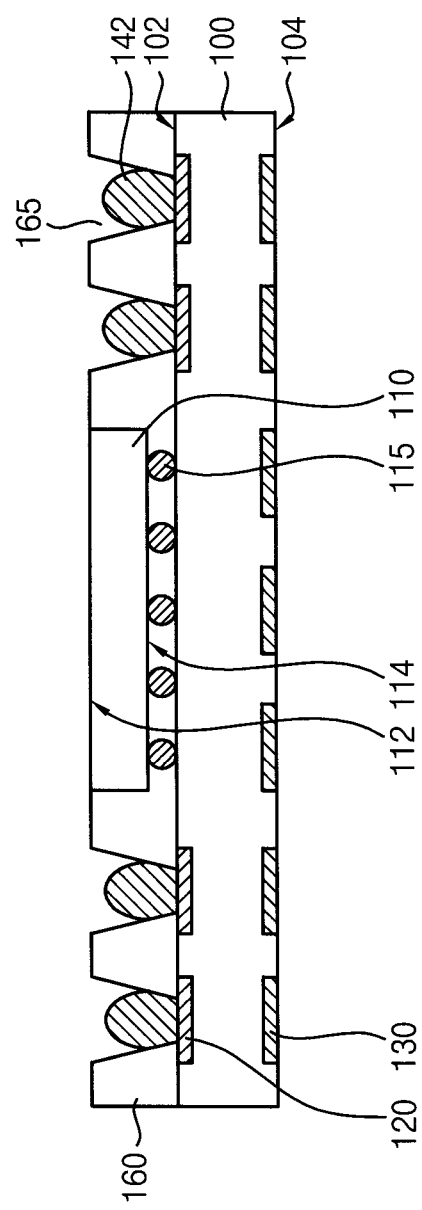
Figure 10:
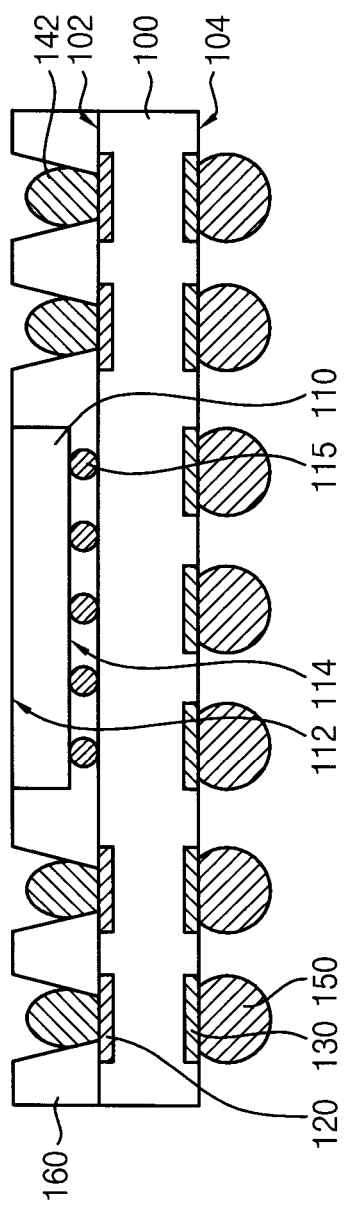
Figure 11:
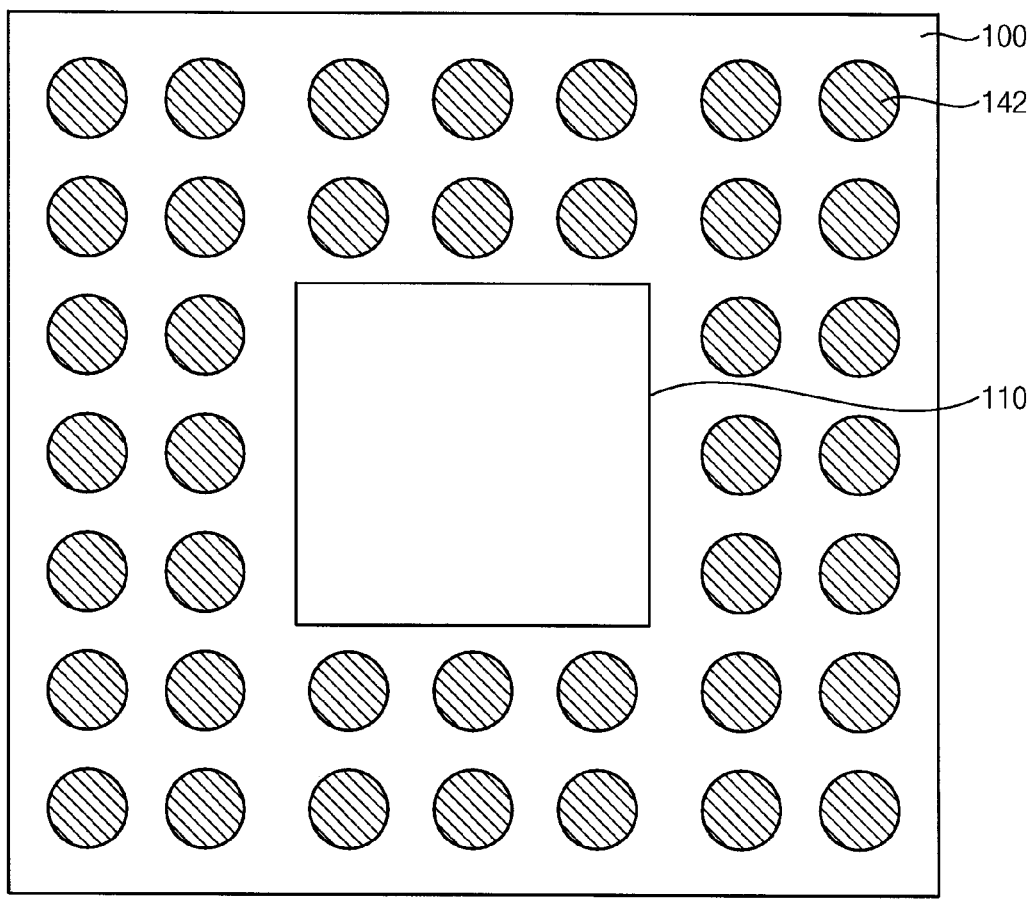

FIGS. 7 to 13 illustrate a method of manufacturing a stack package in accordance with an example embodiment. FIGS. 7 to 10, 12 and 13 are cross-sectional views illustrating a method of manufacturing a stack package in accordance with the example embodiment. FIG. 11 is a plan view of FIG. 10.

Figure 7:
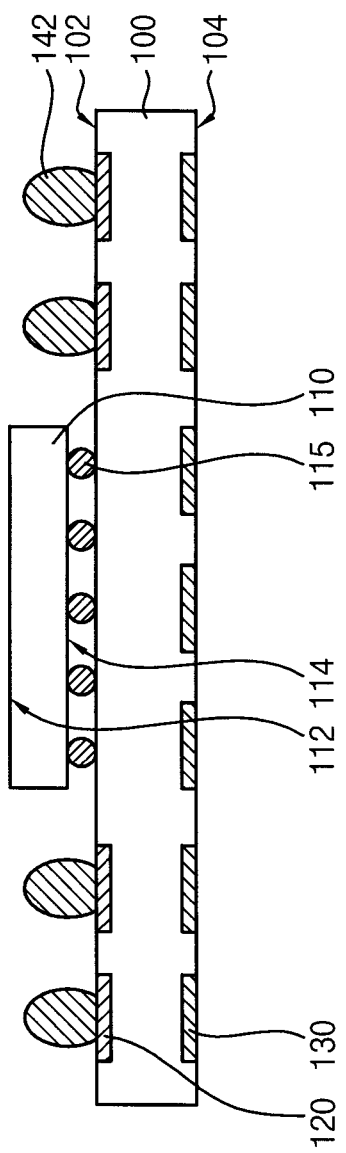

Referring to FIG. 7, a first semiconductor chip 110 is mounted on a first package substrate 100, and then, first bumps 142 are attached to an upper surface 102 of the first substrate 100.

The first substrate 100 has first and second pads 120 and 130. In example embodiments, the first substrate 100, for example, may be a PCB. A plurality of the first pads 120 are formed on the upper surface 102 of the first substrate 100. The first pads 120 may be arranged, for example, at equal intervals. A plurality of second pads 130 are formed on a lower surface 104 of the first substrate 100. The first and second pads 120 and 130 may include a conductive material, for example, a metal.

The first semiconductor chip 110 may be mounted on the first substrate 100 by a plurality of conductive bumps 115. For example, after the conductive bumps 115 including solder balls may be arranged on a central portion of the upper surface 102 of the first substrate 100, the first semiconductor chip 110 may be arranged over the central portion of the upper surface 102 of the first substrate 100 so that a bottom surface 114 of the first semiconductor chip 110 may contact the conductive bumps 115. A reflow process may be performed on the conductive bumps 115 so that the conductive bumps 115 may be attached to the bottom surface 114 of the first semiconductor chip 110 and the upper surface 102 of the first substrate 100.

Referring to FIG. 7, a plurality of first bumps 142 including solder is disposed on the first pads 120, respectively, and is attached to top surfaces of the first pads 120, respectively, through a reflow process.

Figure 8:
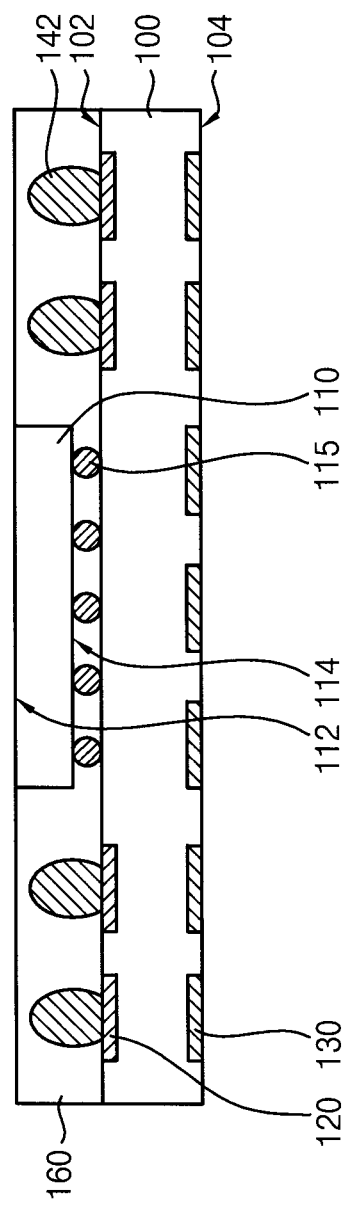

Referring to FIG. 8, a first molding member 160 is formed on the first substrate 100 sufficiently to cover the first semiconductor chip 110 and the first bumps 142. The first molding member 160 may be planarized until a top surface 112 of the first semiconductor chip 110 is exposed. The first molding members 160, for example, may be formed using EMC.

Referring to FIG. 9, the first molding member 160 is partially removed to form a plurality of first openings 165 exposing respective top surfaces of the first pads 120.

In example embodiments, the first openings 165 may be formed with a laser drill or a mechanical drill.

Referring to FIGS. 10 and 11, outer connection members 150 are attached to a bottom surface 104 of the first substrate 100, and a sawing process may be performed to divide the first substrate 100 into a plurality of first semiconductor packages 10.

For example, the outer connection members 150 including solder may be arranged on the second pads 130, respectively and a reflow process may be performed on the outer connection members 150 so that the outer connection member 150 is to be attached to the second pads 130. After coating a temporary adhesive (not illustrated), which may cover the outer connection members 150, on a bottom surface 104 of the first substrate 100, a carrier substrate (not illustrated) may be attached to the temporary adhesive. Then, the first substrate 100 may be divided by a sawing process.

As illustrated in FIG. 11, the first bumps 142 may be arranged on a peripheral region of the first substrate 100 and the first semiconductor chip 110 may be arranged on a chip-mounting region of the substrate 100.

Figure 12:
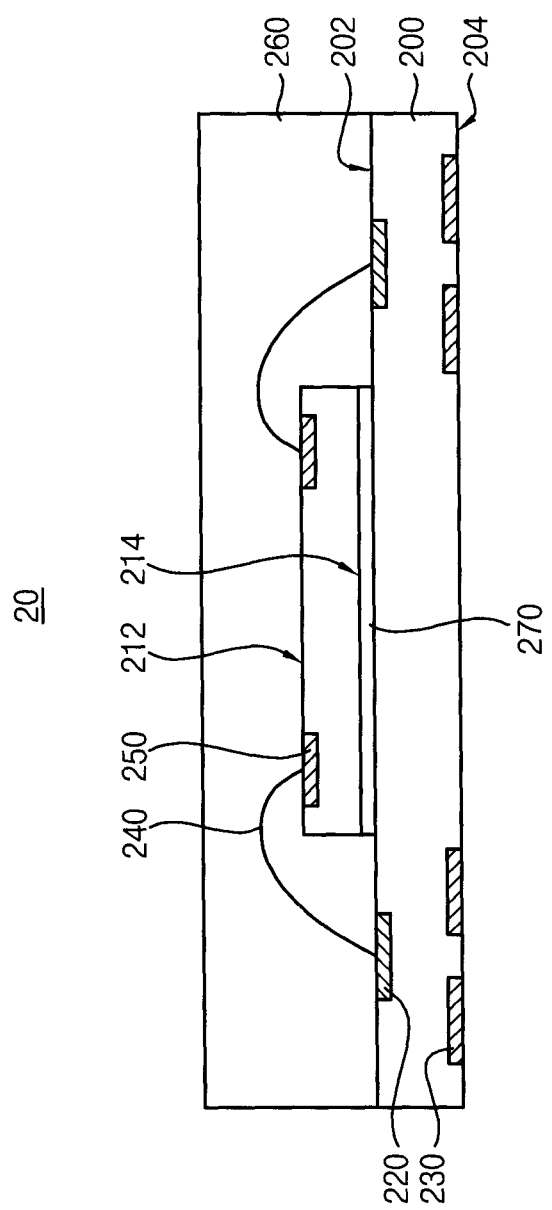

Referring to FIG. 12, a second semiconductor chip 210 is mounted on a second substrate 200. The second substrate 200 and the second semiconductor chip 210 are electrically connected to each other via a conductive wire 240. A second molding member 260 sealing the second semiconductor chip 210 and the conductive wire 240 is formed on the second substrate 200 so that a second semiconductor package 20 is formed.

For example, the second substrate 200 may be a polyimide substrate or a poly ethylene terephthalate substrate, and, in this example embodiment, the second substrate 200 includes third and fourth pads 220 and 230. In this example embodiment, a plurality of fourth pads 230 is formed at lower portions of the second substrate 200. In this example embodiment, a plurality of third pads 220 is formed at an upper portion 202 of the second substrate 200. The third and the fourth pads 220 and 230 may include a conductive material, for example, a metal.

An adhesive layer 270 is formed on a central portion of a top surface 202 of the second substrate 200, and a bottom surface 204 of the second semiconductor chips 210 is in contact with the adhesive layer 270, and the second semiconductor chip 210 is mounted on the second substrate 200. The second semiconductor chip 210 includes a plurality of fifth pads 250 at an upper surface 212 thereof. The fifth pads 250 may include a conductive material, for example, a metal.

The conductive wires 240 are arranged to connect the fifth pads 250 of the second semiconductor chip 210 with the third pads 220 of the second substrate 200, respectively.

The second molding member 260 may be formed using an insulating material, for example, EMC.

Figure 13:
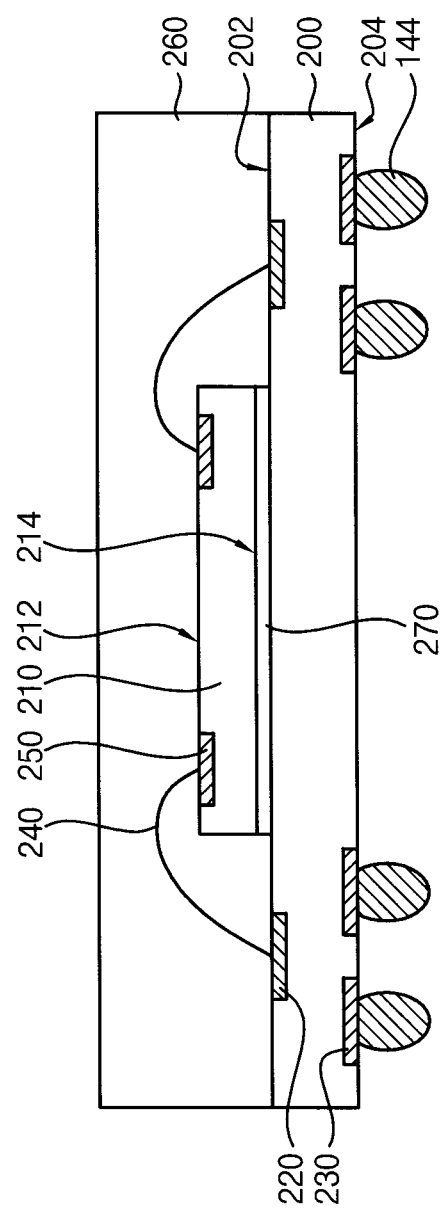

Referring to FIG. 13, second conductive bumps 144 are attached on a bottom surface 204 of the second semiconductor package 20. For example, the second conductive bumps 144 including solders may be arranged on the fourth pads 230, respectively, of the second substrate 200, and may be attached to the fourth pads 230 by a reflow process.

Referring to FIG. 1 again, the second semiconductor package 20 may be arranged on the first semiconductor package 10, and the first and second semiconductor packages 10 and 20 may be combined to each other to manufacture the stack package.

For example, after providing the second conductive bumps 144 formed on the bottom surface 204 of the second substrate 200 on the first conductive bumps 142 formed on the top surface 102 of the first substrate 100, a reflow process may be performed to combine the second conductive bumps 144 and the first conductive bumps 142 to form the conductive connection members 140.

The carrier substrate and the temporary adhesive attached to the bottom surface 104 of the first substrate 100 may be removed, and outer connection members 150 may be mounted on the mainboard (not illustrated).

Figure 14:
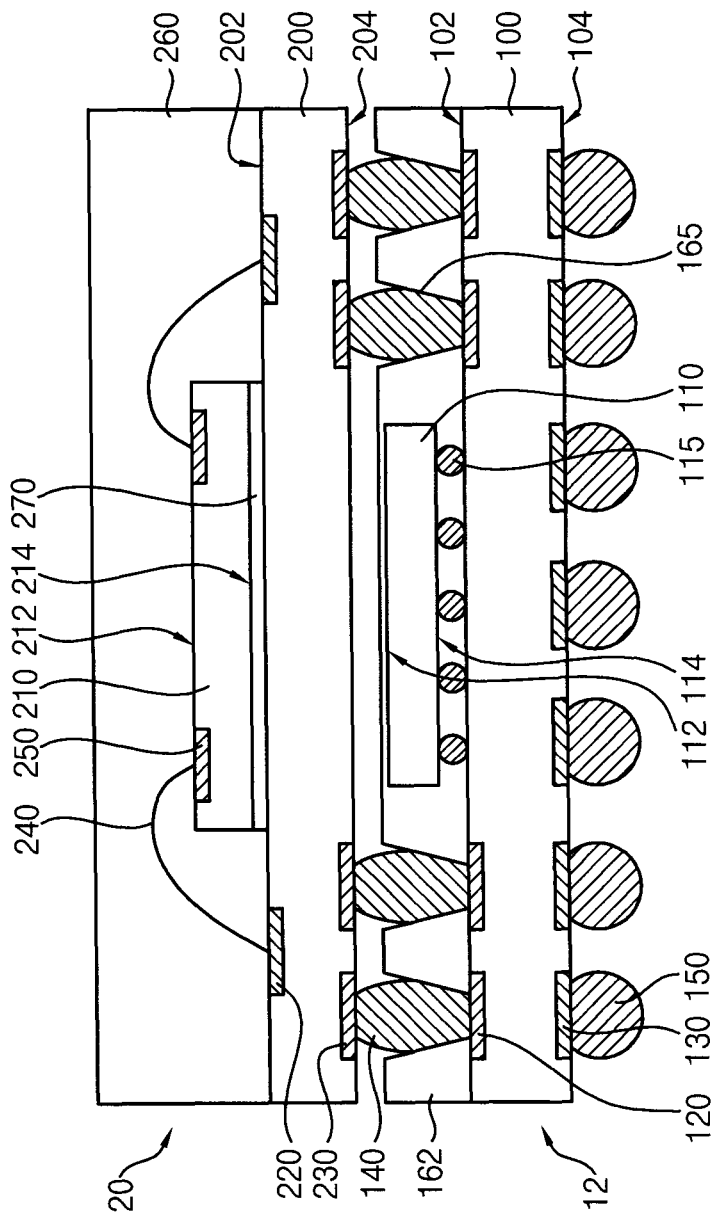

FIG. 14 is a cross-sectional view illustrating a stack package in accordance with an example embodiment. The stack package may be substantially the same as or similar to that of FIG. 1 except for the molding member. Thus, like reference numerals refer to like elements, and detailed descriptions thereon are omitted herein.

Referring to FIG. 14, the stack package 3 includes a third semiconductor package 12 and a second semiconductor package 20. The stack package 3 includes conductive connection members 140. The third semiconductor package 12 includes a first substrate 100, a first semiconductor chip 110, and a third molding member 162.

The third molding member 162 covers a top surface 112 as well as a side wall and a bottom surface 114 of the first semiconductor chip 110. When the top surface 112 of the first semiconductor chip 110 is covered by the third molding member 162, the first semiconductor chip 110 and the second package 20 may be insulated, and thus the conductive connection members 140 may have top surfaces substantially coplanar with the top surface of the third molding member 162. The third molding member 162 may have first openings 165 exposing top surfaces of first pads 120. The third molding member 162 may include an insulating material, for example, epoxy molding compound (EMC).

For example, the first substrate 100 may be a printed circuit board (PCB) and may have first and second pads 120 and 130. The first substrate 100 may further include various wirings (not illustrated) which are electrically connected to the first and/or the second pads 120 and 130.

The first and second pads 120 and 130 may include a conductive material, for example, a metal.

The first semiconductor chip 110 may be mounted on the first substrate 100, e.g., on a central portion of a top surface 102 of the first substrate 100.

The first semiconductor chip 140 may include an application processor (AP) chip, a logic chip, etc.

For example, the second substrate 200 may include polyimide or poly ethylene terephthalate. Hereinafter, a modulus of the first substrate 100 is referred to as a first modulus and a modulus of the second substrate 200 is referred to as a second modulus. For example, when the first substrate 100 is a printed circuit board and the second substrate 200 includes polyimide or poly ethylene terephthalate, the second modulus may be less than the first modulus. The second substrate 200 may have a higher heat resistance and may be relatively thin, lightweight and flexible. Also, the second substrate 200 may have insulating properties and a higher glass transition temperature (TG).

In example embodiments, the second modulus may be within a range of about 1 GPa to about 7 GPa.

In example embodiments, a glass transition temperature of the second substrate 200 may be equal to or greater than 250 degrees Celsius.

The first semiconductor chip 210 may include, e.g., a memory chip.

For example, the second molding member 260 may include an insulating material, e.g., EMC. The second molding member 260 may be formed on the second substrate 200, and may seal the second semiconductor chip 210, the adhesive layer 270, and the conductive wires 240, thereby protecting the second semiconductor chip 210 from external environment.

Figure 15:
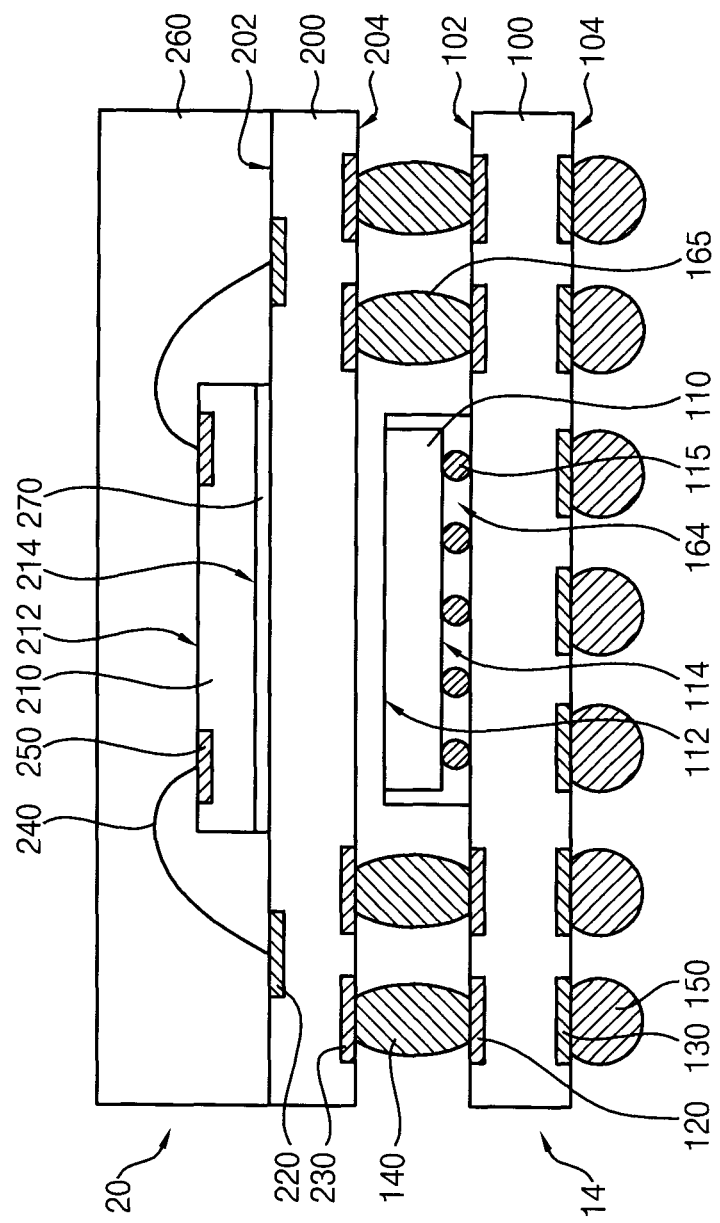

FIG. 15 is a cross-sectional view illustrating a stack package in accordance with an example embodiment. The stack package may be substantially the same as or similar to that of FIG. 1 except for the molding member. Thus, like reference numerals refer to like elements, and detailed descriptions thereon are omitted herein.

Referring to FIG. 15, the stack package 5 includes a fourth semiconductor package 14 and a second semiconductor package 20. The stack package 5 includes conductive connection members 140. The fourth semiconductor package 14 includes a first substrate 100, a first semiconductor chip 110, and a fourth molding member 164.

The fourth molding member 164 is provided on the first substrate 100 to cover at least a portion of the first semiconductor chip 110. In example embodiments, the fourth mold member 164 covers a sidewall and a bottom surface 114 of the first semiconductor chip 110. However, the fourth molding member 164 does not cover first pads 120.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stack package, comprising:
    a first semiconductor package including a first substrate having a first modulus and at least one first semiconductor chip mounted on the first substrate; and
    a second semiconductor package stacked on the first semiconductor package, the second semiconductor package including a second substrate having a second modulus and at least one semiconductor chip mounted on the second substrate, the first modulus being greater than the second modulus.

2. The stack package of claim 1, wherein the second modulus is within a range of about 1 GPa to about 7 GPa.

3. The stack package of claim 1, wherein the second substrate includes at least one of polyimide and poly ethylene terephthalate.

4. The stack package of claim 1, wherein a glass transition temperature of the second substrate is greater than a glass transition temperature of the first substrate.

5. The stack package of claim 1, wherein a glass transition temperature of the second substrate is greater than or equal to 250 degrees Celsius.

6. The stack package of claim 1, wherein the first semiconductor package further comprises:
    a first molding member covering the first semiconductor chip.

7. The stack package of claim 6, wherein an upper surface of the first semiconductor chip is exposed by the first molding member.

8. The stack package of claim 1, further comprising:
    a plurality of conductive connection members interposed between the first and the second substrates and providing electrical connectivity therebetween.

9. The stack package of claim 8, wherein the conductive connection members are arranged on a peripheral region of the first substrate.

10. A method of manufacturing a stack package, the method comprising:
    forming a first semiconductor package by mounting at least one first semiconductor chip on a first substrate having a first modulus;
    forming a second semiconductor package by mounting at least one second semiconductor chip on a second substrate having a second modulus, the second modulus being less than the first modulus; and
    stacking the second semiconductor package on the first semiconductor package.

11. The method of claim 10, wherein the second modulus is within a range of about 1 GPa to about 7 GPa.

12. The method of claim 10, wherein the second substrate includes at least one of polyimide and poly ethylene terephthalate.

13. The method of claim 10, wherein a glass transition temperature of the second substrate is greater than a glass transition temperature of the first substrate.

14. The method of claim 10, wherein a glass transition temperature of the second substrate is greater than or equal to 250 degrees Celsius.

15. The method of claim 10, wherein the stacking the second semiconductor package on the first semiconductor package includes interposing a plurality of conductive connection members between the first and the second substrates to provide electrical connections therebetween.

16. A stack package, comprising:
    a first semiconductor package including a first substrate having a first modulus and at least one first semiconductor chip mounted on the first substrate; and
    a second semiconductor package on the first semiconductor package, and the second semiconductor package including a second substrate having a second modulus, the first modulus being greater than the second modulus.

17. The stack package of claim 16, wherein the first semiconductor package further includes a first molding member covering the first semiconductor chip, the first molding member at least partially exposing an upper surface of the first semiconductor chip.

18. The stack package of claim 16, further comprising:
- at least one first pad on an upper surface of the first substrate;
- at least one second pad on a lower surface of the second substrate; and
- at least one conductive connection member interposed between the first and the second substrates and electrically connecting the first and second pads.

19. The stack package of claim 18, wherein the first semiconductor package further includes a first molding member covering the first semiconductor chip and exposing the first pad.

20. The stack package of claim 19, wherein the conductive connection member at least partially fills openings in the first molding member, the conductive connection member protruding from a top surface of the first molding member.

* * * * *